(12) United States Patent
Ise et al.

(10) Patent No.: US 6,281,580 B1
(45) Date of Patent: Aug. 28, 2001

(54) LSI PACKAGE AND INNER LEAD WIRING METHOD FOR SAME

(75) Inventors: Hisao Ise; Hitoshi Takahashi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/274,768

(22) Filed: Mar. 24, 1999

(30) Foreign Application Priority Data

Aug. 11, 1998 (JP) .................................................. 10-227231

(51) Int. Cl.⁷ ........................... H01L 23/48; H01L 23/52; H01L 29/40
(52) U.S. Cl. ............................................ 257/734; 257/784
(58) Field of Search .................................. 257/734, 784, 257/786, 690, 692

(56) References Cited

U.S. PATENT DOCUMENTS

| 5,592,025 | * | 1/1997 | Clark et al. | 257/774 |
| 5,650,593 | * | 7/1997 | McMillan et al. | 257/734 |
| 5,686,699 | * | 11/1997 | Chu et al. | 257/774 |
| 5,895,968 | * | 4/1999 | Barber | 257/734 |

FOREIGN PATENT DOCUMENTS 8-125051    5/1996 (JP) .

* cited by examiner

Primary Examiner—Olik Chaudhuri
Assistant Examiner—Phat X. Cao
(74) Attorney, Agent, or Firm—Armstrong, Westerman, Hattori, McLeland & Naughton, LLP

(57) ABSTRACT

A face up BGA package has a plurality of terminals and lead pads on a package substrate. Connecting some of the terminals to their corresponding lead pads via nonconnection terminals when changing the size of a chip mounted on the package substrate makes it possible to connect all necessary terminals and lead pads by using inner leads without short circuiting the inner leads and without shortage of space in which to wire the inner leads.

4 Claims, 10 Drawing Sheets

LSI PACKAGE AND INNER LEAD WIRING METHOD FOR SAME

BACKGROUND OF THE INVENTION

1. Field of the Invention

The present invention relates generally to an LSI package and an inner lead wiring method for same, and more particularly to a face up ball grid array (BGA) package and an inner lead wiring method for same.

2. Description of the Related Art

In recent years, as demand for smaller, cheaper LSI packages for use in electronic equipment has increased, the BGA package has come to replace the quad flat package (QFP) as the LSI package of choice due to its smaller surface area and greater ease of installation.

The face up BGA package in particular comprises a chip having a plurality of bonding pads and a package substrate for mounting the chip. A plurality of terminals are arranged on a grid on a surface of the package substrate on which the chip is mounted, and a plurality of lead pads are aligned around the periphery of the package substrate.

The plurality of bonding pads on the chip are connected by bonding wire to the corresponding respective lead pads on the package substrate and the plurality of lead pads are connected by inner leads to the corresponding respective terminals.

It should be noted that there is a limit to the length of the bonding wire. If the bonding wire is too long, then the resistance and inductance of the bonding wire increase to the point that the characteristics of the chip may be lost. In addition, assembly and production output may decline.

Accordingly, as the size of the chip mounted on the package substrate decreases the limitation on the length of the bonding wire results in the lead pads aligned around the periphery of the package substrate being positioned closer to the center of the package substrate.

However, as described above, with the face up BGA package the position of the lead pad changes according to the size of the chip mounted on the package substrate. As a result, it is very difficult to configure the package so that the same lead pad and terminal are securely connected without crossed wiring regardless of changes in the size of the chip, that is, so that so-called pin compatibility is maintained. Therefore a low-cost face up BGA package that maintains pin compatibility regardless of changes in the size of the chip is desirable.

With the conventional face up BGA package, attempts have been made to maintain pin compatibility by, for example, changing the position of the bonding pads provided on the chip or by using multilayer wiring of the inner leads connecting the lead pads and the terminals.

However, changing the position of the bonding pads according to the size of the chip requires altering the layout of the chip itself, which is time-consuming and costly.

Moreover, there is the additional problem that other types of package variations, for example pin grid array (PGA) QFP, are rendered unusable with the chip even when available, because the chip layout has been altered by the changing of the position of the bonding pads.

Additionally, multilayering of the inner lead wiring raises the cost of the package, offsetting the lower-cost advantage of the reduction in chip size that was one of the original reasons for adopting the BGA package in the first place.

SUMMARY OF THE INVENTION

Accordingly, it is a general object of the present invention to provide an LSI package and an inner lead wiring method for same, in which the problems described above are eliminated.

Another and more specific object of the present invention is to provide a face up BGA package that can be produced quickly and at low cost, and that maintains pin compatibility without the need to alter the position of the bonding pads even when changing the size of the chip, and an inner lead wiring method for same.

In particular, the above-described objects of the present invention are achieved by an LSI package comprising:

a chip; and a package substrate on which are provided a plurality of terminals and a plurality of lead pads, the lead pads connected by bonding wire to the chip, wherein the plurality of lead pads and the plurality of terminals are connected by inner leads provided on an upper surface of the package substrate, the plurality of terminals including nonconnection terminals not connected to corresponding inner leads for which external electrical connection of the chip is unnecessary, the nonconnection terminals positioned at predetermined positions regardless of the position of the lead pads provided on the upper surface of the package substrate.

By providing the LSI package as described above, it is possible to prevent the occurrence of short circuits between inner leads as well as a shortage of wiring space. As a result, it is possible to always connect in identical combinations each of the remaining leads with their corresponding lead pads on a one-to-one basis, regardless of the actual position of the lead pads on the package substrate. That is, even though the position of the lead pads on the package substrate changes as the size of the chip mounted on the package substrate decreases, there is no change in the corresponding relation between the LSI package terminals and the chip terminals, that is, the bonding pads, connected to the lead pads by bonding wire. As a result, LSI package pin compatibility is maintained.

Additionally, it should be noted that it is possible to provide these nonconnection terminals in a quantity equal to the difference between the number of terminals on the package substrate and the number of terminals, that is, bonding pads, on the chip.

Additionally, the above-described objects of the present invention are also achieved by the LSI package as described above, wherein at least some of the plurality of terminals are connected by the inner leads to corresponding lead pads via the nonconnection terminals.

By providing the LSI package described above, it is possible to connect terminals for which inner lead wiring space on the package substrate has disappeared because the size of the chip mounted on the package substrate has decreased to their corresponding lead pads via the nonconnection terminals. As a result, it is possible to maintain the same corresponding relation between the LSI package terminals and the chip terminals, that is, the bonding pads, connected to the lead pads by bonding wire as existed before the size of the chip was decreased, thereby maintaining LSI package pin compatibility.

Further, the above-described objects of the present invention are also achieved by the LSI package as described above, wherein the LSI package comprises a face up BGA package.

By providing an LSI package comprising a face up BGA package, it is possible to provide a face up BGA package that maintains pin compatibility.

Additionally, the above-described objects of the present invention are also achieved by an inner lead wiring method for the LSI package as described above, the inner lead wiring method comprising the steps of:

(a) selecting the nonconnection terminals not connected to corresponding inner pads for which external electrical connection of the chip is unnecessary, positioned at predetermined positions regardless of the position of the lead pads positioned on the upper surface of the package substrate; and (b) wiring the inner leads so as to connect terminals other than the nonconnection terminals and corresponding lead pads.

By providing the inner lead wiring method described above, it is possible to select the terminals that will be nonconnection terminals and to always connect in identical combinations each of the remaining terminals with their corresponding lead pads on a one-to-one basis, thereby maintaining LSI package pin compatibility.

Further, the above-described objects of the present invention are also achieved by the inner lead wiring method as described above, the method further comprising the step of connecting terminals having no space in which to connectably wire the inner leads and corresponding lead pads via the nonconnection terminals by using the inner leads.

By utilizing the nonconnection terminals to connect to their corresponding lead pads those terminals for which inner lead wiring space has been eliminated due to a reduction in the size of the chip and a consequent repositioning of the lead pads 3, it is possible to maintain LSI package pin compatibility.

By providing the LSI package and an inner lead wiring method for same as described above, in which nonconnection terminals not connected to corresponding lead pads are provided on the package substrate and are used as necessary when wiring the inner leads, it is possible to provide a face up BGA package that maintains pin compatibility despite changes in the size of the mounted chip.

Other objects, features and advantages of the present invention will become more apparent from the following detailed description when read in conjunction with the accompanying drawings.

DESCRIPTION OF THE PREFERRED EMBODIMENTS

A detailed description will now be given of an embodiment of a BGA package according to the present invention, with reference to FIG. 1 through FIG. 9.

Figure 1:
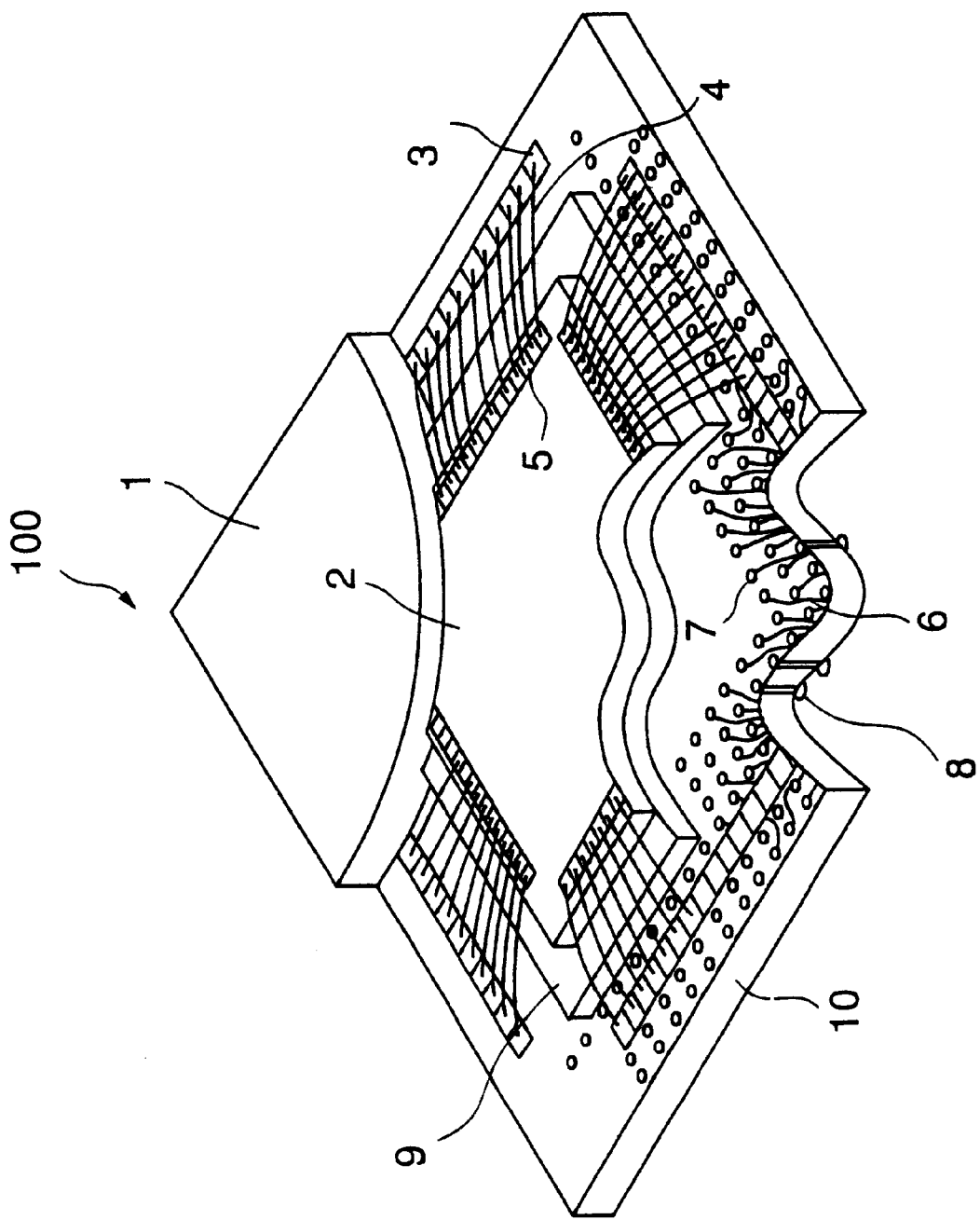
FIG. 1 is an oblique cutaway view of the BGA package of the present invention.

FIG. 1 is an oblique cutaway view of a BGA package 100 of the present invention. Additionally, FIG. 2 is a cross-sectional view of the BGA package 100.

Figure 2:
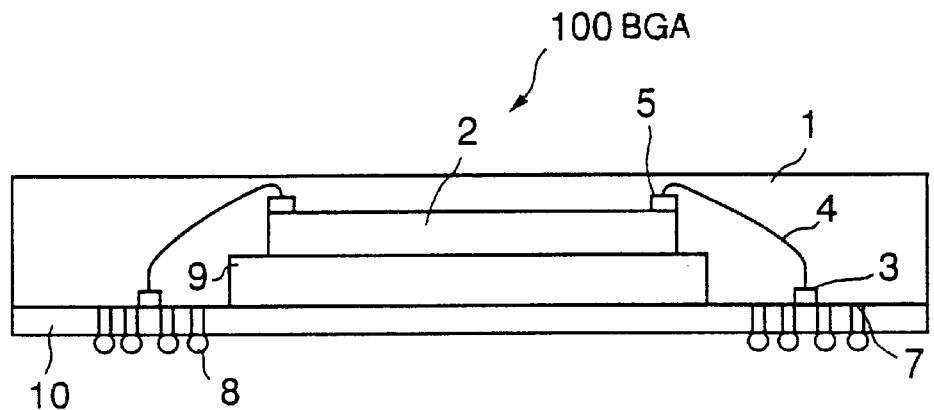
FIG. 2 is a cross-sectional view of the BGA package of the present invention.

As shown in FIG. 1 and FIG. 2, the BGA package 100 comprises a plastic module 1, lead pads 3, bonding wire 4, bonding pads 5, inner leads 6, terminals 7, solder balls 8, an insulator 9 and a package substrate 10. The package substrate 10 may be an insulator made of BT resin or polyimide, for example, while the insulator 9 may be made of, for example, epoxy resin.

The BGA package 100 is a face up type. A chip 2 having a bonding pad 5 on its upper surface is mounted on a side of the package substrate 10 opposite the package substrate 10 surface on which the solder balls 8 are arranged. The insulator 9 is sandwiched between the package substrate 10 and the chip 2. The bonding pads 5 are aligned along the periphery of the chip 2, while the lead pads 3 are aligned along the periphery of the package substrate 10. The bonding pads 5 and the lead pads 3 are connected by bonding wire 7, while the lead pads 3 and terminals 7 are connected by the inner leads 6.

The chip to be used in the BGA package 100 shown in FIG. 1 and FIG. 2 is one of reduced size and reduced cost brought about by refinements in process technology. As noted previously, there is a limit to the length of the bonding wire 7. If the bonding wire is too long, then the resistance and inductance of the bonding wire increase to the point that the characteristics of the chip may be lost. In addition, assembly and production output may decline.

Figure 3:
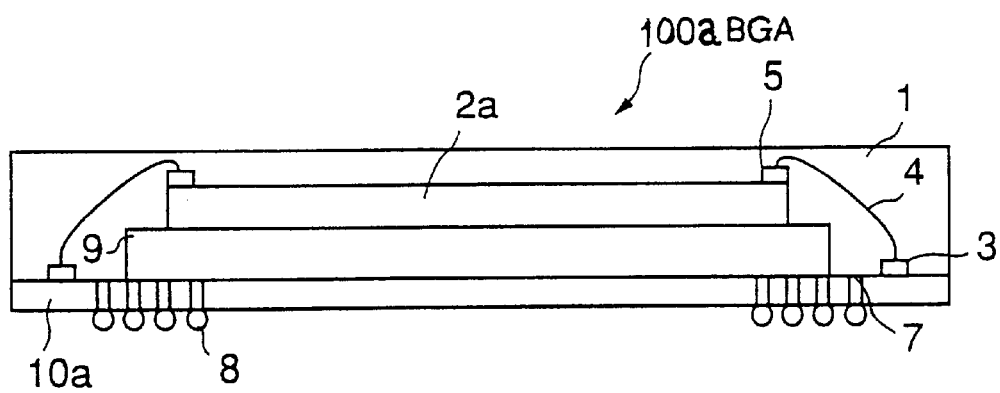
FIG. 3 is a cross-sectional view of a BGA package having a chip of large size.

Accordingly, as previously noted, when a chip 2 of reduced size is used with the BGA package 100 the limitation on the length of the bonding wire 5 results in the lead pads 3 aligned around the periphery of the package substrate 10 being positioned closer to the center of the package substrate 10 among the plurality of terminals 7. FIG. 3, for example, shows a cross-sectional view of a BGA package 100 having a chip 2a that is larger in size than the chip 2 shown in FIG. 1 and FIG. 2 and a package substrate 10a in which the lead pads 3 are aligned around the outside of the terminals 7.

Figure 4:
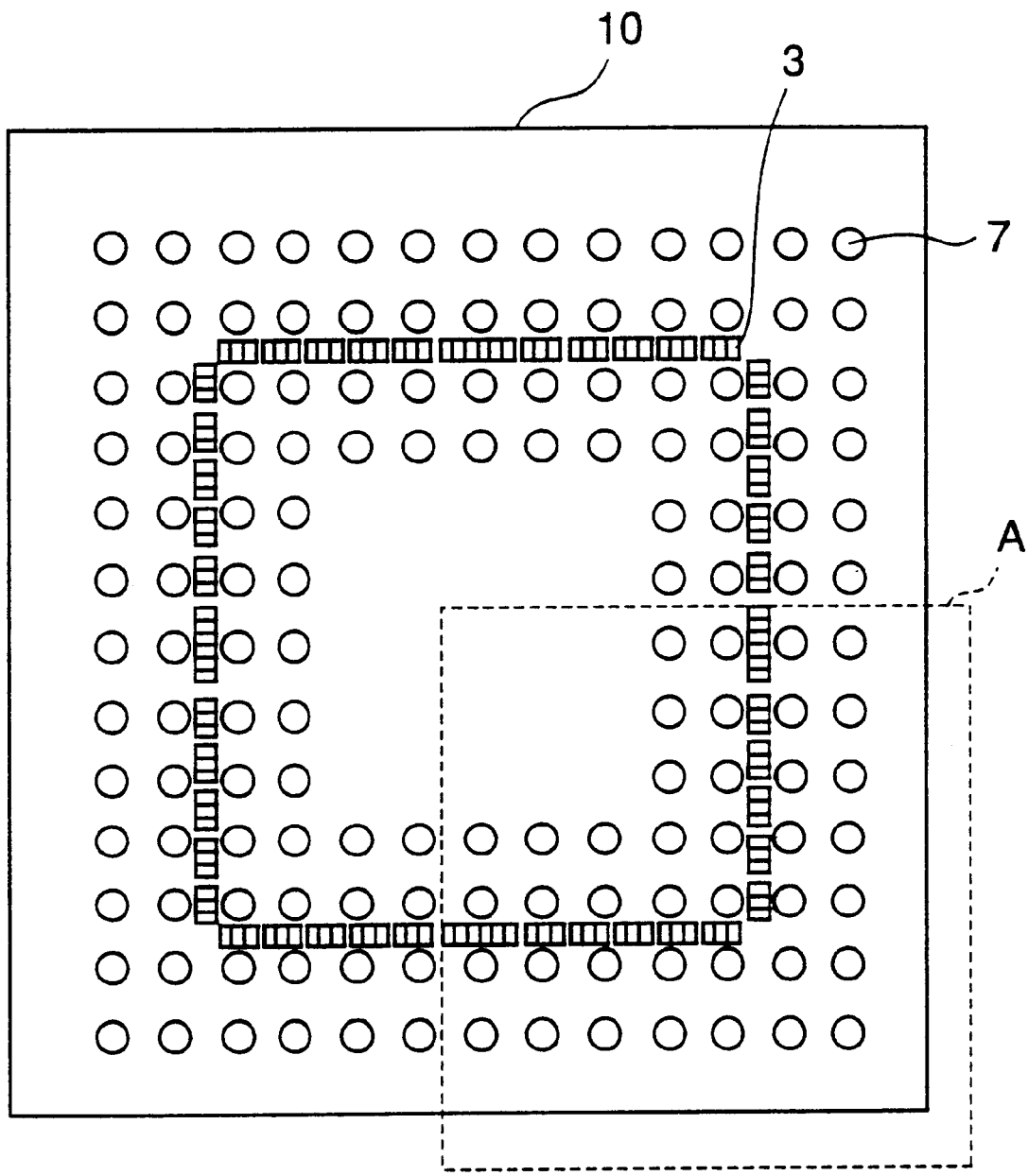
FIG. 4 is a diagram showing an arrangement of terminals and of lead pads on an upper surface of the package substrate.

FIG. 4 is a diagram showing an arrangement of terminals 7 and of lead pads 3 on an upper surface of the package substrate 10. As shown in FIG. 4, the package substrate 10 has 144 lead pads 3 and 144 terminals 7. The 144 terminals 7 are arranged on a grid on the package substrate 10 and the 144 lead pads 3, in accordance with the limitations on the length of the bonding wire 4, are arranged in parallel lines around the periphery of the package substrate 10 and among the terminals 7. It should be noted that the number of lead pads 3 and terminals 7 provided on the package substrate 10 are not limited to 144.

Figure 5:
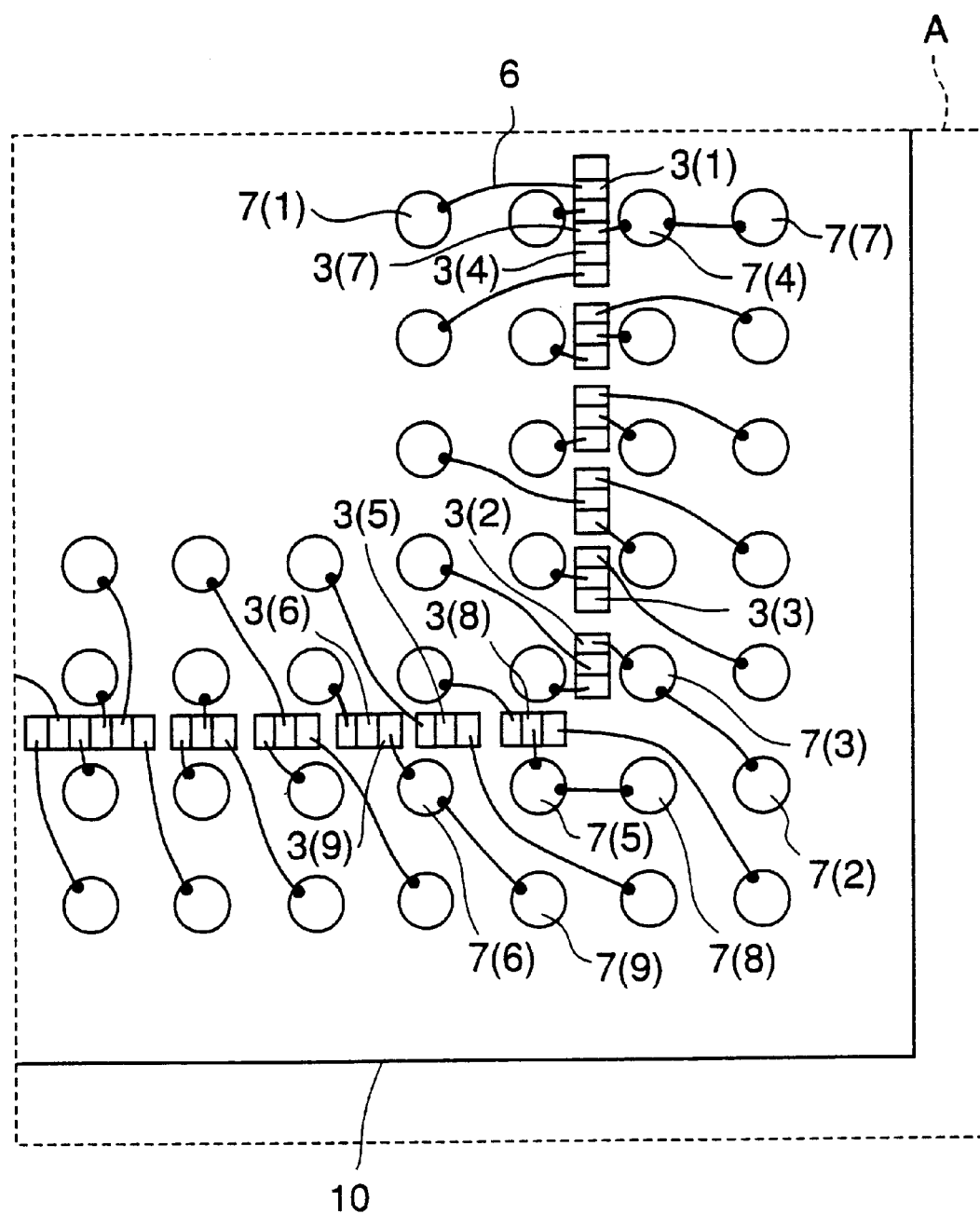
FIG. 5 is a diagram showing an expanded view of the inner lead wiring within an area A shown in FIG. 4.

FIG. 5 is a diagram showing an expanded view of the inner lead wiring within an area A shown in FIG. 4. For purposes of explanation it should be noted that some of the 40 lead pads 3 and terminals 7 within area A have been labeled as lead pads 3(1) through 3(9) and terminals 7(1) through 7(9). Given the length of the distance between adjacent terminals 7 and the thickness of the inner lead 6, it is possible to wire a maximum of two inner leads 6 between adjacent terminals 7.

As shown in FIG. 5, terminal 7(1) is directly connected to lead pad 3(1) by inner lead 6. At the same time, terminal 7(2) is connected to lead pad 3(2) via terminal 7(3). Accordingly, terminal 7(3) is not needed to electrically connect externally the chip 2, and terminal 7(3) is thus a nonconnection terminal not connected to a corresponding lead pad 3(3). Additionally, terminals 7(4), 7(5) and 7(6), like terminal 7(3), are nonconnection terminals not connected to corresponding lead pads 3(4), 3(5) and 3(6), respectively. Terminals 7(7), 7(8) and 7(9) are connected to corresponding lead pads 3(7), 3(8) and 3(9), respectively, via respective nonconnection terminals 7(4), 7(5) and 7(6).

Figure 6:
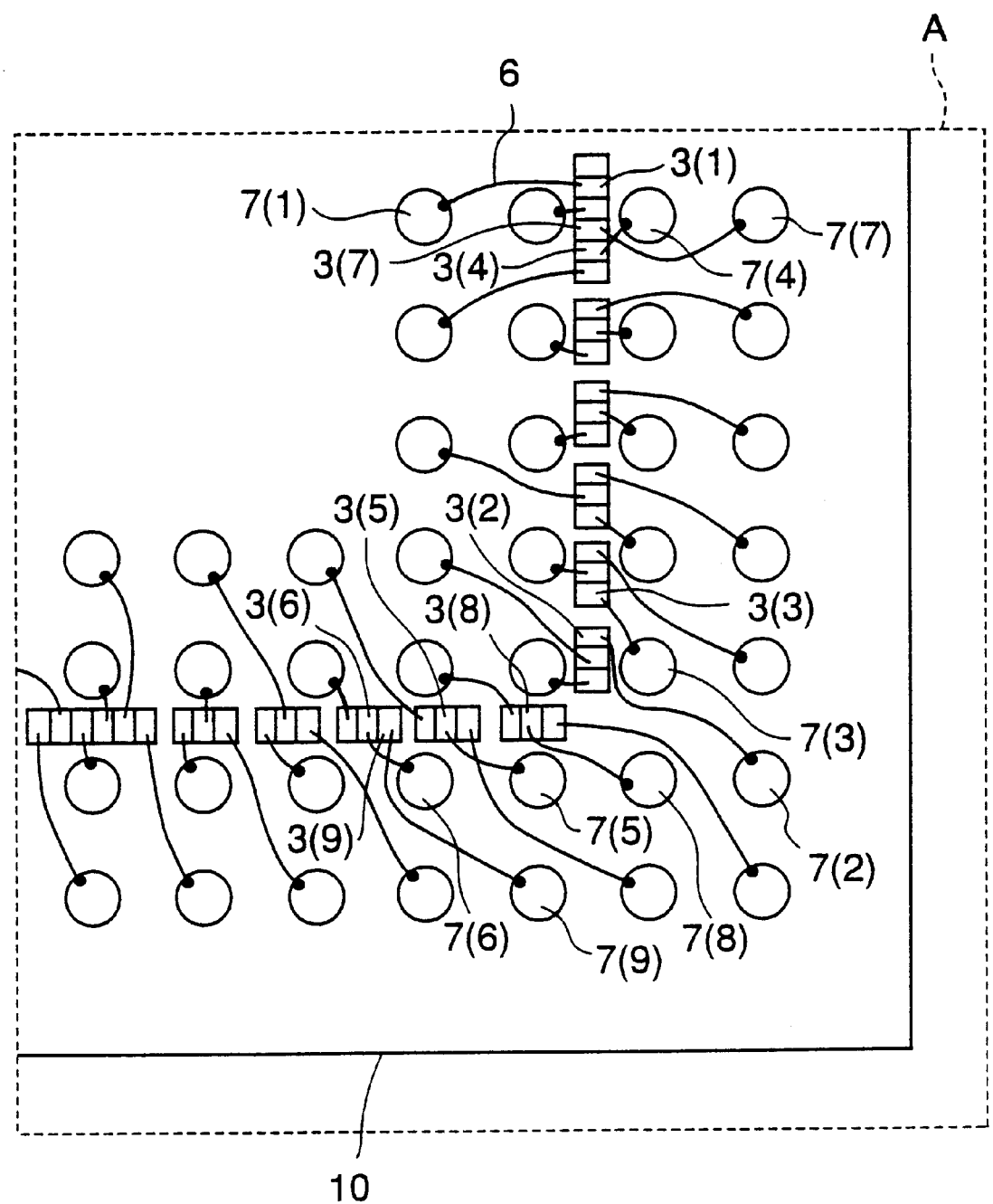
FIG. 6 is a diagram showing the inner lead wiring within area A in a state in which there are no nonconnection terminals.

It should be noted that, were terminals 7(4), 7(5) and 7(6) not nonconnection terminals and were thus connected to corresponding lead pads 3(4), 3(5) and 3(6), respectively, then the state of the wiring of the inner leads 6 would be as shown in FIG. 6. As shown in FIG. 6, the inner leads 6 cross in the vicinity of terminals 7(4), 7(5) and 7(6) and, as for example the inner lead 6 connecting terminal 7(2) with lead pad 3(2), the inner lead 6 must be laid down within a very narrow space. In some instances, there is no space within which to wire the inner lead 6 at all.

By contrast, the BGA package 100 of the present invention eliminates the causes of short circuits of the inner leads 6 and a lack of space for wiring the inner leads 6 by making those terminals 7 for which external electrical connection of the chip 2 is unnecessary into nonconnection terminals, and, further, by using these nonconnection terminals to connect terminals 7 to corresponding lead pads 3.

Additionally, the BGA package 100 of the present invention maintains pin compatibility because terminals 7 other than the nonconnection terminals are quickly connected to the same lead pads 3 regardless of the alignment position of the lead pads 3 on the package substrate 10 and regardless of the size of the chip 2 mounted on the package substrate 10.

A description will now be given of the method of wiring the inner leads 6 of the BGA package 100 of the present invention.

Figure 7:
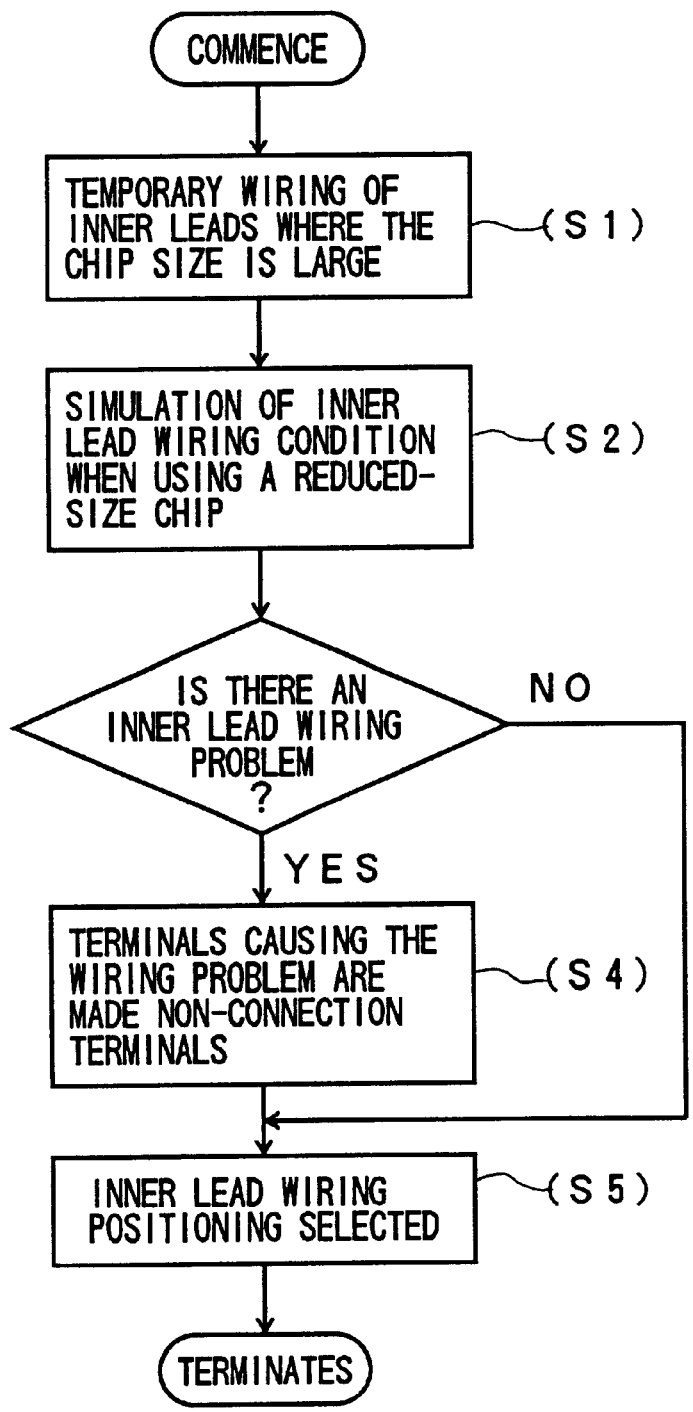
FIG. 7 is a flow chart showing steps in a process of wiring the inner leads.
Figure 8:
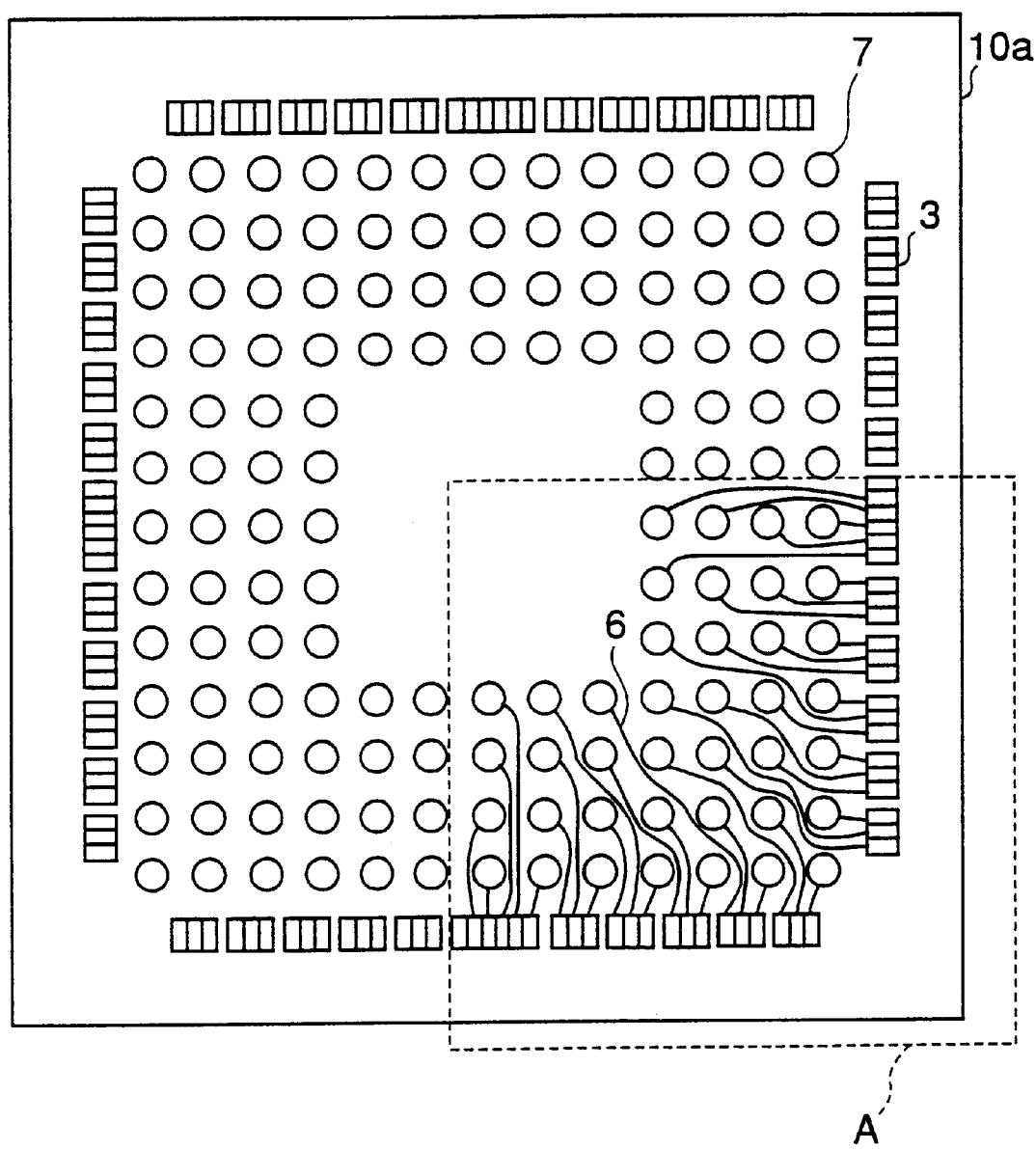
FIG. 8 is a diagram showing the inner lead wiring in an area A when using a chip of large size.
Figure 9:
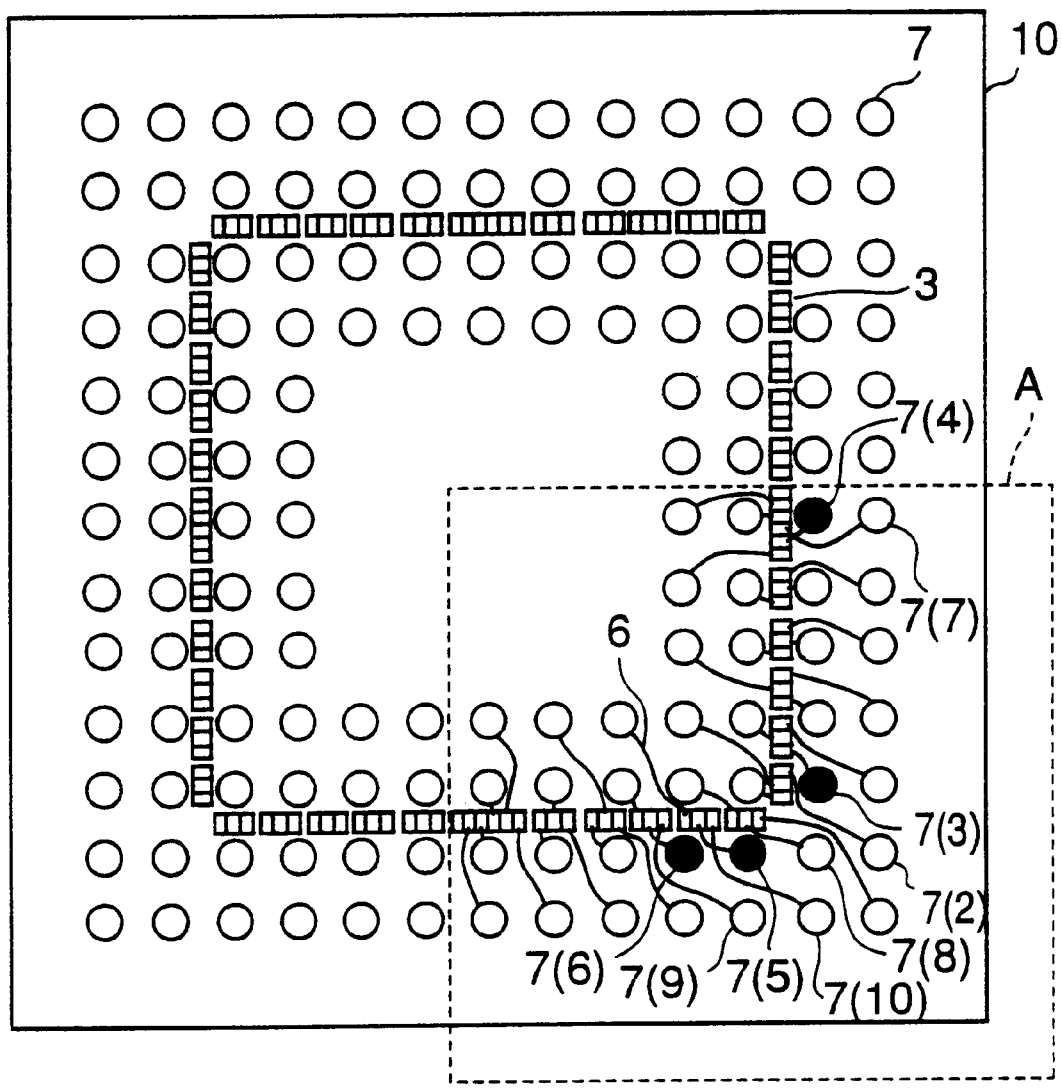
FIG. 9 is a diagram showing inner lead wiring inconveniences/problems within an area A when using a chip of small size.
Figure 10:
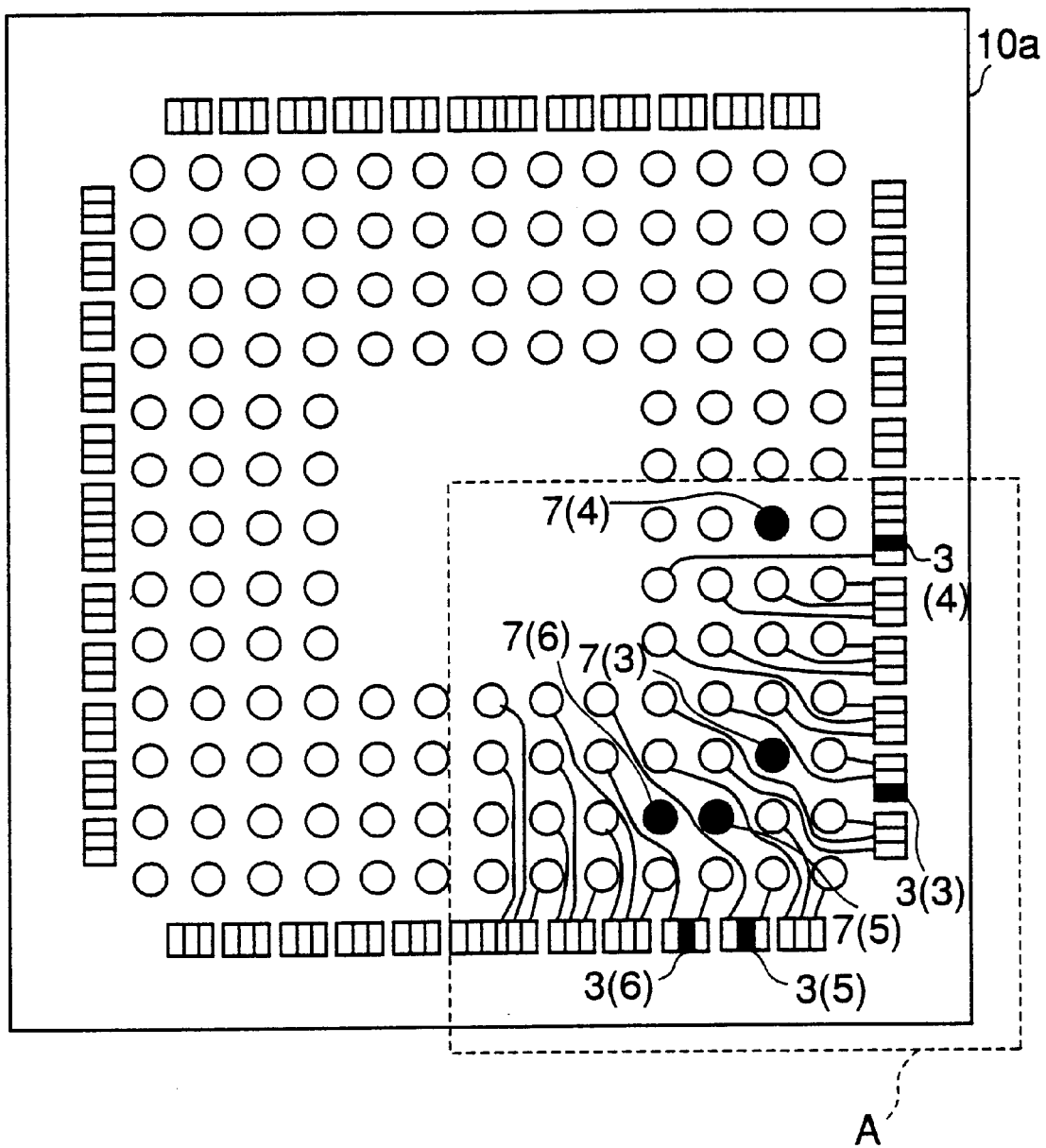
FIG. 10 is a diagram showing a state of connection of nonconnection terminals within an area A when using a chip of large size.
Figure 11:
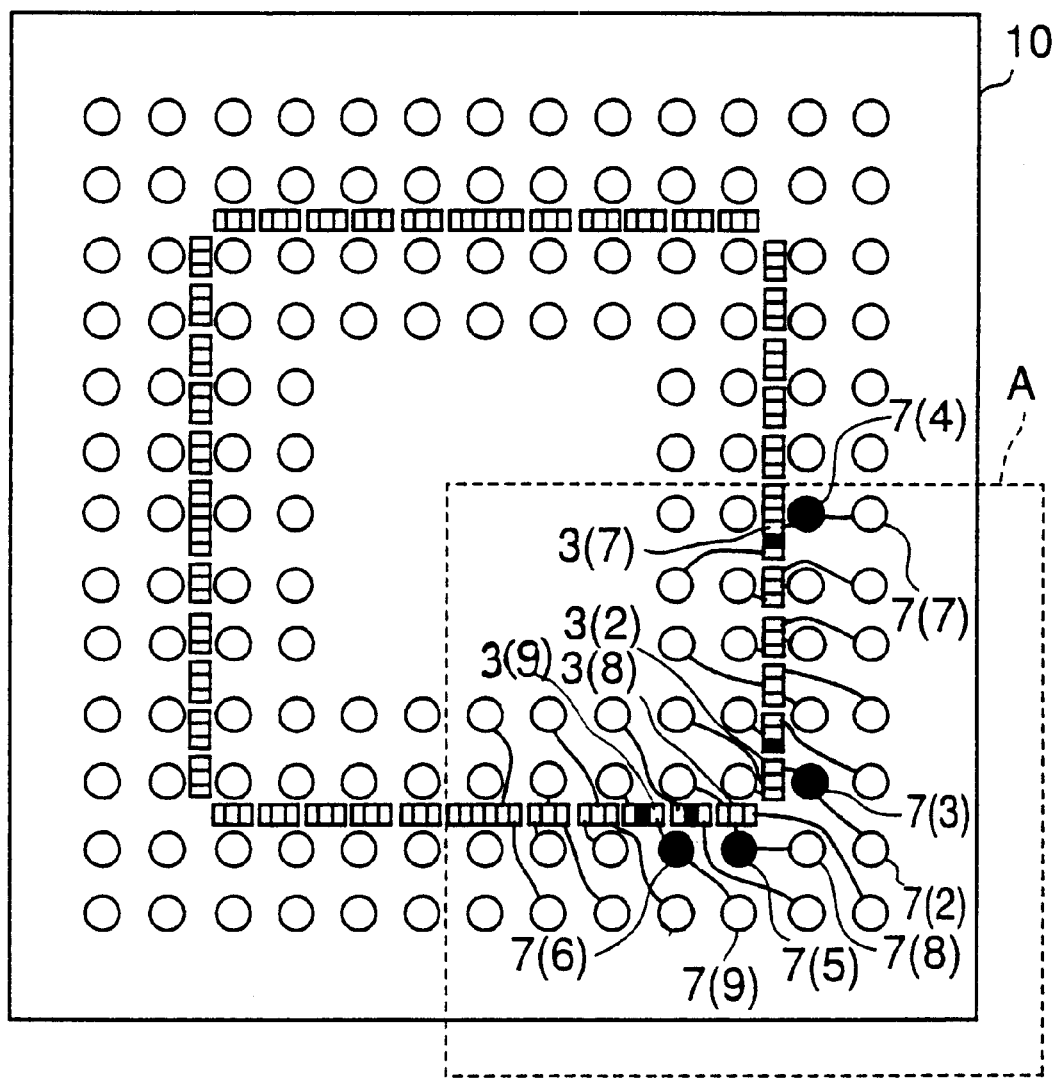
FIG. 11 is a diagram showing a state of connection of nonconnection terminals within an area A when using a chip of small size.

FIG. 7 is a flow chart showing steps in a process of wiring the inner leads. FIG. 8, FIG. 9. FIG. 10 and FIG. 11 are diagrams showing a state of the inner leads 6 within an area A on the package substrate 10 at each step in the process described in FIG. 7.

Step S1 involves the selection of the wiring of the inner leads 6 for a package substrate 10 on which a large-size chip 2a is mounted and on which the lead pads 3 are to be arranged outside the outer periphery of the terminals 7.

FIG. 8 shows an example of the wiring of the inner leads 6 as determined in the step S1 described above. As shown in FIG. 8, there is a lead pad for every terminal and a terminal for every lead pad, each connected to its respective counterpart by an inner lead 6.

Next, a step S2 involves simulating the wiring of the inner leads 6 for a package substrate 10 on which a large-size chip 2a is mounted and on which the lead pads 3 are to be arranged among the terminals 7. At this time the state of the wiring of the inner leads 6 as determined in step S1, that is, the connections between the lead pads 3 and terminals 7 as determined in step S1, can be seen.

If the results of the simulation of step S2 described above indicate no short circuiting of the inner leads and no shortage of space in which to wire the inner leads, then in a step S3 the inner lead wiring as determined in step S1 is adopted for use with the package substrate 10 and the process of wiring the inner leads 6 terminates.

However, if the results of the simulation of step S2 indicate short circuiting of the inner leads 6 or a shortage of space in which to wire the inner leads 6 or both, then in a step S4 the terminals 7 causing these wiring problems are made into nonconnection terminals for which external electrical connection of the chip 2 is unnecessary.

FIG. 9 is a diagram showing a state of inner lead 6 wiring problems, that is, short circuiting or a shortage of space in which to wire the inner leads or both, within area A when using a chip of small size while maintaining the original connections between the lead pads 3 and the terminals 7 of FIG. 8 as described above. Specifically, the inner leads 6 of terminal 7(4) and terminal 7(7), terminal 7(5) and terminal 7(10), and terminal 7(6) and terminal 7(9) cross. Additionally, the existence of terminals 7(3) and 7(5) makes the space in which to wire the inner leads 6 for terminals 7(2) and 7(8) very narrow.

Accordingly, in this case, terminals 7(3), 7(4), 7(5) and 7(6) that cause the wiring problems described above, and which are indicated in FIG. 10 by solid black circles, are made into nonconnection terminals. It should be noted that the number of these nonconnection terminals can only be identical to the difference between the number of terminals on the package substrate 10 and the number of bonding pads 5 on the chip 2.

Once the nonconnection terminals have been selected, in a step S5 the positioning of the inner lead wiring is selected according to the arrangement of the lead pads 3 on the package substrate 10. At this time, if no inner lead 6 wiring problems occur even without the use of nonconnection terminals 7(3), 7(4), 7(5) and 7(6), then terminals other than nonconnection terminals 7(3), 7(4), 7(5) and 7(6) are connected directly to their corresponding lead pads 3. However, if inner lead 6 wiring problems occur unless all or some of the nonconnection terminals 7(3), 7(4), 7(5) and 7(6) are used, then the necessary nonconnection terminals are used in the connection of the terminals 7 and the lead pads 3.

FIG. 10 is a diagram showing a state of connection of nonconnection terminals 7(3), 7(4), 7(5) and 7(6) within an area A when mounting a chip of large size 2a on a package substrate 10a. As shown in FIG. 10, no inner lead 6 wiring problems occur even without the use of nonconnection terminals 7(3), 7(4), 7(5) and 7(6). Thus, terminals 7 other than the nonconnection terminals 7(3), 7(4), 7(5) and 7(6) are connected directly to their corresponding lead pads 3, respectively. Accordingly, nonconnection terminals 7(3), 7(4), 7(5) and 7(6) are not connected to their corresponding lead pads 3 (3), 3(4), 3(5) and 3(6).

On a BGA package mounting a large-size chip 2a, nonconnection terminals 7(3), 7(4), 7(5) and 7(6) remain unconnected to any lead pad, thus widening the space for wiring the inner leads 6 to connect the remaining terminals 7.

FIG. 11 is a diagram showing a state of connection of nonconnection terminals 7(3), 7(4), 7(5) and 7(6) within area A when mounting a chip of small size on the package substrate 10. As shown in FIG. 11, nonconnection terminals 7(3), 7(4), 7(5) and 7(6) remain unconnected to their corresponding lead pads indicated in black 3(3), 3(4), 3(5) and 3(6) while terminals 7(2), 7(7), 7(8) and 7(9) are connected to their corresponding lead pads 3(2), 3(7), 3(8) and 3(9) via nonconnection terminals 7(3), 7(4), 7(5) and 7(6). Accordingly, the short circuiting of inner leads 6 and the shortage of inner lead 6 wiring space is eliminated.

It should be noted that when there are a large number of terminals, the inner lead wiring of the present invention may be multilayer wiring, thus maintaining BGA package pin compatibility.

By providing the BGA package and inner lead wiring method described above, it is possible to maintain the corresponding relation between individual LSI package terminals and their corresponding chip terminals, that is, the bonding pads, connected to the lead pads by bonding wire, despite reductions in the size of the chip mounted on the package substrate as well as changes in the position of the lead pads on the surface of the package substrate 3, and thus it is possible to provide an LSI package that maintains pin compatibility. Additionally, because pin compatibility is maintained according to the present invention despite changes in the position of the lead pads on the package substrate, it is not necessary to change the arrangement of the bonding pads to match the chip size, that is, to change the layout of the chip itself, making it possible to achieve reductions in revision time as well as cost.

The above description is provided in order to enable any person skilled in the art to make and use the invention and sets forth the best mode contemplated by the inventors of carrying out their invention.

The present invention is not limited to the specifically disclosed embodiment, and variations and modifications may be made without departing from the scope of the present invention.

The present application is based on Japanese priority application No. 10-227231 filed on Aug. 11, 1998, the entire contents of which are hereby incorporated by reference.

What is claimed is:

1. An LSI package comprising:

a chip; and a package substrate on which are provided a plurality of terminals and a plurality of lead pads, the lead pads connected by bonding wire to the chip, wherein the plurality of lead pads and the plurality of terminals are connected by inner leads provided on an upper surface of the package substrate, the plurality of terminals including nonconnection terminals not connected to corresponding inner leads for which external electrical connection of the chip is unnecessary, the nonconnection terminals positioned at predetermined positions regardless of the position of the lead pads provided on the upper surface of the package substrate.

2. The LSI package as claimed in claim 1, wherein at least some of the plurality of terminals are connected by the inner leads to corresponding lead pads via the nonconnection terminals.

3. The LSI package as claimed in claim 1, wherein the LSI package comprises a face up BGA package.

4. A LSI package comprising:

a chip;

an insulator; and a package substrate on which are provided a plurality of terminals and a plurality of lead pads, the lead pads connected by bonding wire to the chip, the chip being mounted on the insulator, which in turn is mounted on an upper surface of the package substrate, the plurality of lead pads and the plurality of terminals connected by inner leads provided on the upper surface of the package substrate, the plurality of terminals including nonconnection terminals not connected to corresponding inner leads for which external electrical connection of the chip is unnecessary, the nonconnection terminals positioned at predetermined positions regardless of the position of the lead pads provided on the upper surface of the package substrate.

* * * * *